(12) United States Patent
Liou et al.

(10) Patent No.: US 10,663,853 B2
(45) Date of Patent: May 26, 2020

(54) EXTREME ULTRAVIOLET MASK

(71) Applicant: UNITED MICROELECTRONICS CORP., Hsin-Chu (TW)

(72) Inventors: En-Chiuan Liou, Tainan (TW); Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 99 days.

(21) Appl. No.: 15/481,479

(22) Filed: Apr. 7, 2017

(65) Prior Publication Data

US 2018/0239235 A1 Aug. 23, 2018

(30) Foreign Application Priority Data

Feb. 17, 2017 (TW) .............................. 106105197 A

(51) Int. Cl.
*G03F 1/22* (2012.01)
*G03F 1/24* (2012.01)

(52) U.S. Cl.
CPC . *G03F 1/24* (2013.01); *G03F 1/22* (2013.01)

(58) Field of Classification Search
CPC ...................................... G03F 1/22; G03F 1/24
See application file for complete search history.

(56) References Cited

U.S. PATENT DOCUMENTS

| | | | |
|---|---|---|---|
| 6,607,862 B2 * | 8/2003 | Yan | B82Y 10/00 430/5 |
| 6,905,801 B2 | 6/2005 | Liang et al. | |
| 7,060,401 B1 * | 6/2006 | LaFontaine | B82Y 10/00 430/5 |
| 7,807,318 B2 * | 10/2010 | Park | B82Y 10/00 430/311 |
| 7,947,415 B2 * | 5/2011 | Amano | B82Y 10/00 430/5 |
| 8,372,564 B2 | 2/2013 | Shoki | |
| 8,765,331 B2 * | 7/2014 | Gallagher | G03F 1/24 430/5 |
| 8,968,969 B2 | 3/2015 | Kim et al. | |
| 9,217,923 B2 | 12/2015 | Singh | |
| 9,280,044 B2 | 3/2016 | Takai | |
| 9,645,484 B2 * | 5/2017 | Kim | G03F 1/24 |
| 2003/0162005 A1 * | 8/2003 | Shoki | B32B 7/02 430/5 |
| 2007/0090084 A1 * | 4/2007 | Yan | B82Y 10/00 216/13 |
| 2007/0224523 A1 * | 9/2007 | Huh | B82Y 10/00 430/5 |
| 2009/0220869 A1 * | 9/2009 | Takai | B82Y 10/00 430/5 |

(Continued)

FOREIGN PATENT DOCUMENTS

| | | | | |
|---|---|---|---|---|
| JP | 2007-201306 | * | 8/2007 | ............... G03F 1/16 |
| JP | 2012-124196 | * | 6/2012 | ............... G03F 1/22 |

(Continued)

*Primary Examiner* — Martin J Angebranndt
(74) *Attorney, Agent, or Firm* — Winston Hsu

(57) ABSTRACT

An extreme ultraviolet (EUV) mask includes: a substrate having a first region and a second region; a reflective layer on the substrate; an absorbing layer on the reflective layer; and a first recess in the absorbing layer and in part of the reflective layer on the first region. Preferably, a bottom surface of the first recess exposes a top surface of the reflective layer.

4 Claims, 6 Drawing Sheets

(56) References Cited

U.S. PATENT DOCUMENTS

| | | | |
|---|---|---|---|
| 2010/0323280 A1* | 12/2010 | Jeong | B82Y 10/00 430/5 |
| 2011/0300472 A1* | 12/2011 | Komine | G03F 1/44 430/5 |
| 2013/0280643 A1* | 10/2013 | Hsu | G03F 1/24 430/5 |
| 2013/0330661 A1* | 12/2013 | Lamantia | G03F 1/24 430/5 |
| 2014/0127613 A1* | 5/2014 | Kagawa | G03F 1/24 430/5 |
| 2014/0205938 A1* | 7/2014 | Yu | G03F 1/24 430/5 |
| 2014/0212795 A1* | 7/2014 | Tanabe | G03F 1/24 430/5 |
| 2014/0302429 A1* | 10/2014 | Shoki | G03F 1/24 430/5 |
| 2014/0313496 A1* | 10/2014 | Gijsbertsen | G03F 7/70558 355/55 |
| 2015/0098069 A1* | 4/2015 | Lu | G03F 7/70158 355/67 |
| 2015/0198874 A1* | 7/2015 | Ikuta | G03F 1/24 430/5 |
| 2016/0195812 A1 | 7/2016 | Huang et al. | |
| 2016/0274452 A1 | 9/2016 | Kamo | |
| 2017/0038671 A1* | 2/2017 | Takai | G03F 1/24 |
| 2017/0235217 A1* | 8/2017 | Qi | G03F 1/22 716/52 |
| 2017/0336721 A1* | 11/2017 | Suzuki | G03F 1/24 |

FOREIGN PATENT DOCUMENTS

| | | | | |
|---|---|---|---|---|
| JP | 2013-021080 | * | 1/2013 | G03F 7/20 |
| JP | 2013-191663 | * | 9/2013 | G03F 1/24 |
| JP | 2014096483 | * | 5/2014 | G03F 1/24 |
| KR | 2002-0052468 | * | 7/2002 | H01L 21/027 |
| KR | 2010-076696 | * | 7/2010 | H01L 21/027 |
| WO | 2015/141230 | * | 9/2015 | G03F 1/24 |

* cited by examiner

EXTREME ULTRAVIOLET MASK

BACKGROUND OF THE INVENTION

1. Field of the Invention

The invention relates to a mask structure, and more particularly, to an extreme ultraviolet mask (EUV) structure.

2. Description of the Prior Art

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs, and, for these advances to be realized, similar developments in IC manufacturing are needed.

For example, traditional transmissive photolithography is being supplemented or replaced with reflective photolithography. ICs are typically assembled by layering features on a semiconductor substrate using a set of photolithographic masks. Transmissive masks have patterns formed by transmissive regions. During photolithographic exposure, radiation, such as ultraviolet light, passes through the transmissive regions of the mask before striking a photoresist coating on the substrate. The mask transfers the pattern onto the photoresist. In contrast, a reflective mask includes reflective and non-reflective regions. During exposure, the light reflected off the mask is used to form the pattern on the substrate. After either type of exposure, the photoresist is selectively removed to reveal the pattern. The substrate then undergoes processing steps that take advantage of the shape of the remaining photoresist to create circuit features on the substrate. When the processing steps are complete, photoresist is reapplied and substrate is exposed using the next mask. In this way, features are layered to produce the final circuit.

Reflective masks are advantageous in many applications because they can be used in conjunction with relatively higher frequency radiation such as extreme ultraviolet (EUV) radiation. EUV radiation forms more precise patterns and smaller features than conventional UV radiation, but has proven challenging to use in lithography. For example, most mask materials block EUV radiation, making it difficult to manufacture a suitable transmissive mask. In contrast, reflective masks are more easily manufactured and tuned for EUV environments. For this reason and others, reflective masks and reflective lithography have delivered positive results but present challenges as well.

SUMMARY OF THE INVENTION

According to a first embodiment of the present invention, an extreme ultraviolet (EUV) mask includes: a substrate having a first region and a second region; a reflective layer on the substrate; an absorbing layer on the reflective layer; and a first recess in the absorbing layer and in part of the reflective layer on the first region. Preferably, a bottom surface of the first recess exposes a top surface of the reflective layer.

According to a second embodiment of the present invention, an extreme ultraviolet (EUV) mask includes: a substrate having a first region and a second region; a reflective layer on the substrate; an absorbing layer on the reflective layer; and a first recess in the absorbing layer and in part of the reflective layer on the first region. Preferably, a number of the reflective layer directly under the absorbing layer is different from a number of the reflective layer directly under the first recess.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
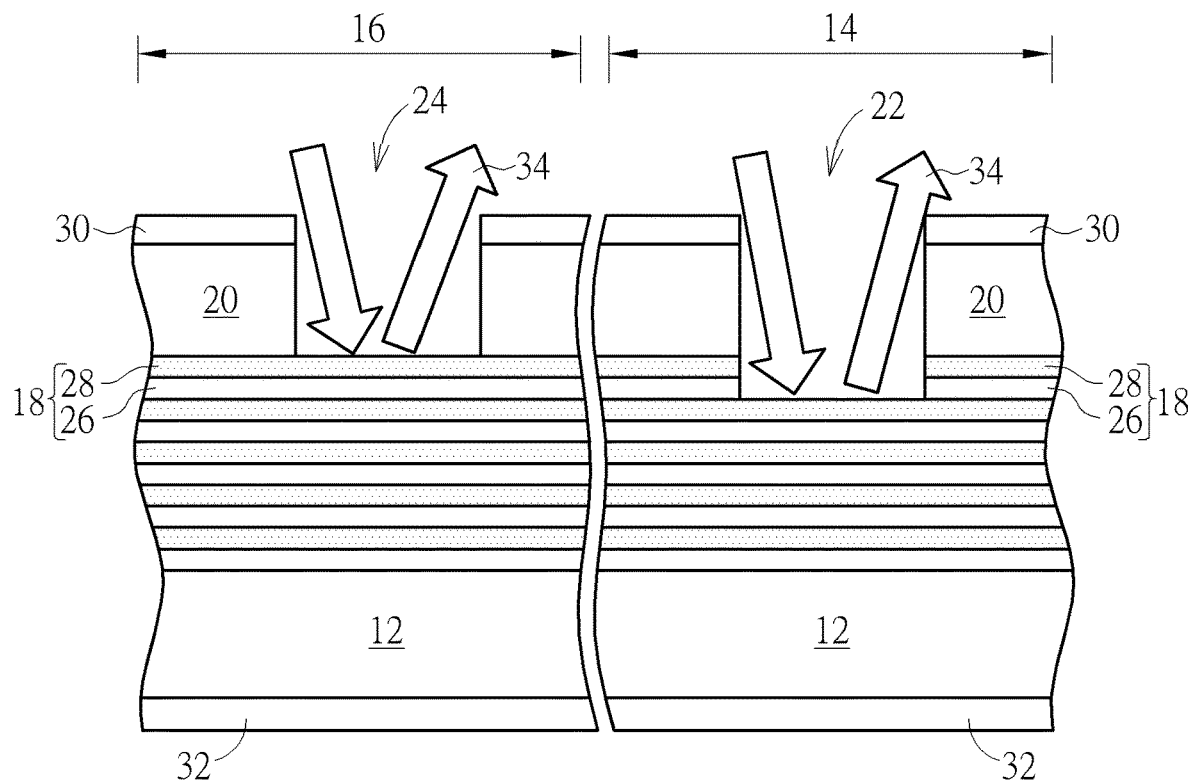
FIG. 1 illustrates a structural view of an EUV mask according to an embodiment of the present invention.

Referring to FIG. 1, FIG. 1 illustrates a structural view of an EUV mask according to an embodiment of the present invention. As shown in FIG. 1, the EUV mask preferably includes a substrate 12, a first region 14 and a second region 16 defined on the substrate 12, a reflective layer 18 on the substrate, an absorbing layer 20 on the reflective layer 18, a first recess 22 in the absorbing layer and in part of the reflective layer on the first region 14, and a second recess 24 in the absorbing layer 20 on the second region 16.

In this embodiment, the reflective layer 18 preferably includes a plurality of alternately stacked first reflective layers 26 and second reflective layers 28, or viewing from a more detailed perspective the reflective layers 18 include a number n of first reflective layers 26 disposed on the substrate 12 and a number n of second reflective layers 28 stacked alternately on the n first reflective layers 26, in which n is greater than 1. Preferably, the first reflective layers 26 and second reflective layers 28 are made of different material, in which both the first reflective layers 26 and second reflective layers 28 could be made of material combination of molybdenum (Mo) and silicon (Si) or material combination of Mo and Beryllium (Be). For instance, according to an embodiment of the present invention, the first reflective layers 26 preferably include silicon and the second reflective layers 28 include Mo while the topmost reflective layer exposed by the first recess 22 and second recess 24 preferably includes Mo. Nevertheless, according to an embodiment of the present invention, it would also be desirable to form the first reflective layers 26 to include Mo and the second reflective layers 28 to include silicon while the topmost reflective layer exposed by the first recess 22 and second recess 24 include silicon, which is also within the scope of the present invention.

Viewing from an overall perspective, the first recess 22 and second recess 24 preferably expose the top surface of the reflective layer 18 on the first region 14 and second region 16 respectively, in which the bottom of the first recess 22 is extended into part of the reflective layer 18 so that the first recess 22 not only exposes the top surface of the reflective layer 18 but also exposes the sidewalls of the reflective layer 18. In other words, since the depth of the first recess 22 is greater than the depth of the second recess 22 while the first recess 22 is extended into the reflective layer 18, the top surface of the reflective layer 18 directly under the second recess 24 is substantially higher than the top surface of the reflective layer 18 directly under the first recess 22.

Viewing from another perspective, the number or quantity of the reflective layers 18 directly under the absorbing layer 20 is different from the number or quantity of the reflective layers 18 directly under the first recess 22 but the same as the number of reflective layers 18 directly under the second recess 24. Since the first recess 22 is extended downward into part of the reflective layers 18, the number of reflective layers 18 directly under the absorbing layer 20 is greater than the number of reflective layers 18 directly under the first recess 22. For instance, the number of reflective layers 18 directly under the absorbing layer 20 is about 10 layers while the number of reflective layers 18 directly under the first recess 22 is about 8 layers. Nevertheless, it would also be desirable to adjust the number of reflective layers 18 directly under the absorbing layer 20 and the number of reflective layers 18 directly under the first recess 22 according to the depth of the first recess 22, which is also within the scope of the present invention.

In this embodiment, the substrate 12 is preferably made of low thermal expansion material (LTEM) including but not limited to for example quartz, LTEM glass, silicon, silicon carbide, silicon oxide, titanium oxide, and/or other low thermal expansion substances known in the art. The absorbing layer 20 is preferably made of Ta-based material, but could also include other material such as Cr, TaN, TaO, TaBN, TiN, or combination thereof.

According to an embodiment of the present invention, a selective patterned mask 30 such as patterned resist could be disposed on top of the absorbing layer 20 to pattern the absorbing layer 20 for forming the first recess 22 and the second recess 24. After forming the first recess 22 and second recess 24, the patterned mask 30 could be removed or remained on the top surface of absorbing layer 20. Moreover, an optional material layer 32 could be disposed on the backside or bottom surface of the substrate 12 for supporting the substrate 12, in which the material layer 32 could include Cr, CrN, CrON, TaSi, or combination thereof.

Typically, an ultraviolet lithography is conducted by using ultraviolet beams with wavelength of 13.5 nm to process to an extreme dimension of approximately 20 nm, which is still currently unreachable by an ArF excimer laser technique. The ultraviolet beams is often obtained from high temperature or high density plasma and light beams generated by plasma after being condensed by a condensing lens or condenser first penetrate an intermediate focus (IF) spot and then illuminate the reflective region or reflective layer of a mask. The ultraviolet beams being reflected by the mask is focused by a projecting optical system onto a photoresist or semiconductor substrate to form a pattern.

Nevertheless, light beams 34 reflected from different regions of a mask, such as from the reflecting region or reflecting layers on first region 14 and second region 16 on the substrate 12 of the present invention often produce mismatch as a result of difference in through pitch focus. To resolve this issue, the present invention preferably forms recesses having different depths in the absorbing layer 20 and reflective layers 18 on first region 14 and second region so that lights reflected on both regions could achieve a compensation of focus shift from the height difference of reflective layers.

Figure 2:
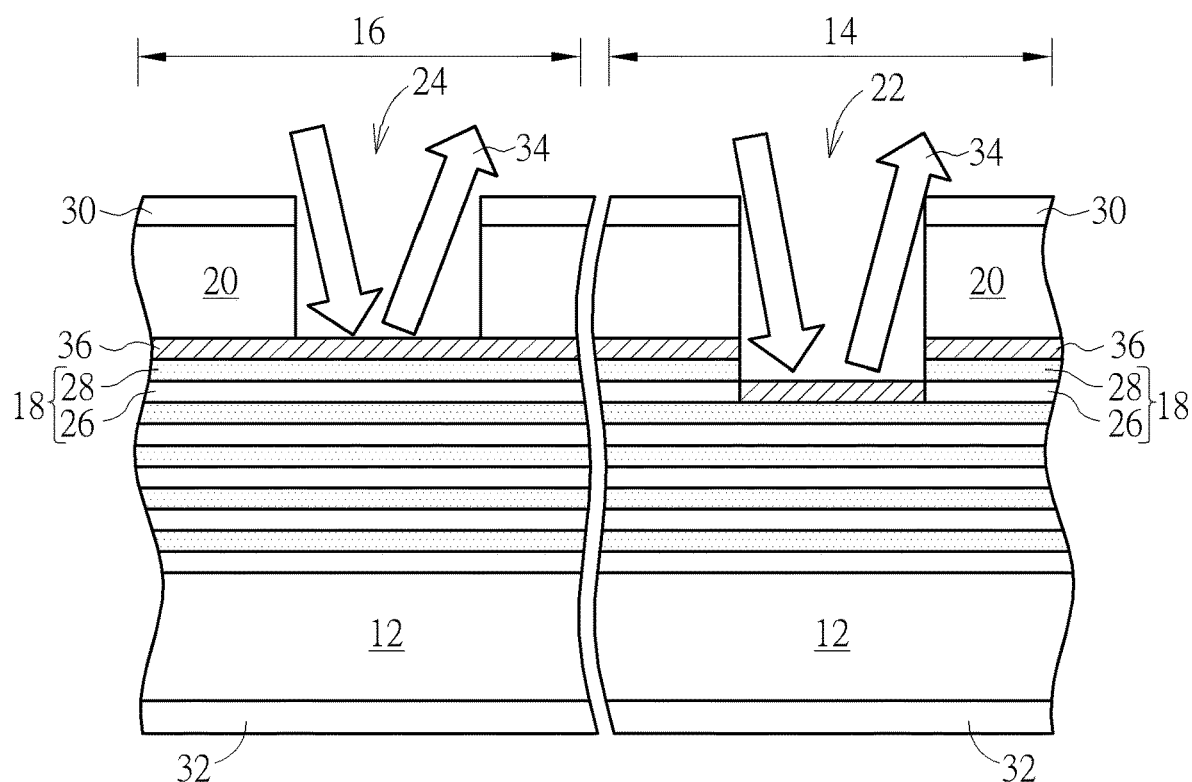
FIG. 2 illustrates a structural view of an EUV mask according to an embodiment of the present invention.

Referring to FIG. 2, FIG. 2 illustrates a structural view of an EUV mask according to an embodiment of the present invention.

Figure 3:
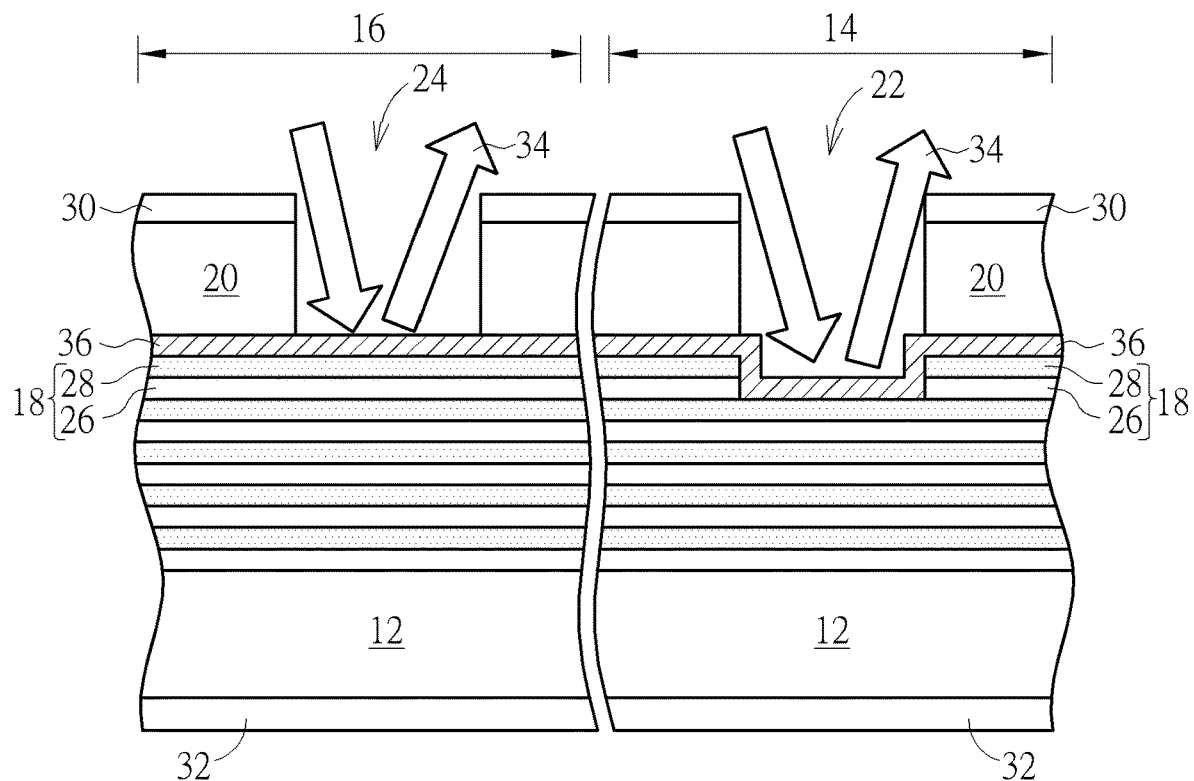
FIG. 3 illustrates a structural view of an EUV mask according to an embodiment of the present invention.

As shown in FIG. 2, it would be desirable to form a capping layer 36 between the reflective layers 18 and absorbing layer 20 for protecting the reflective layers 18. Viewing from an overall structural perspective, the capping layer 36 is preferably disposed on the surface of the topmost reflective layer 18 on the first region 14 and second region 16, in which the capping layer 36 disposed on the bottom of the first recess 22 on first region 14 and the capping layer 36 disposed around the first recess 22 have a height difference. It should be noted that even though the capping layer 36 disposed directly under the absorbing layer 20 on first region 14 is not directly connected or contacting the capping layer 36 directly under the first recess 22, according to an embodiment of the present invention as shown in FIG. 3, the capping layer 36 directly under the first recess 22 could also extend upward along the sidewall of the reflective layer 18 to contact the capping layer 36 directly under the absorbing layer 20, which is also within the scope of the present invention.

Moreover, since the capping layer 36 is disposed on the top surface of the reflective layer 18 before the first recess 22 and second recess 24 are formed, part of the top surface of the capping layer 36 is preferably exposed by the first recess 22 and the second recess 24, in which the top surface of the capping layer 36 directly under the second recess 24 is higher than the top surface of the capping layer 36 directly under the first recess 22. In this embodiment, the capping layer 36 could include Ru, silicon oxide, amorphous carbon, or combination thereof.

Figure 4:
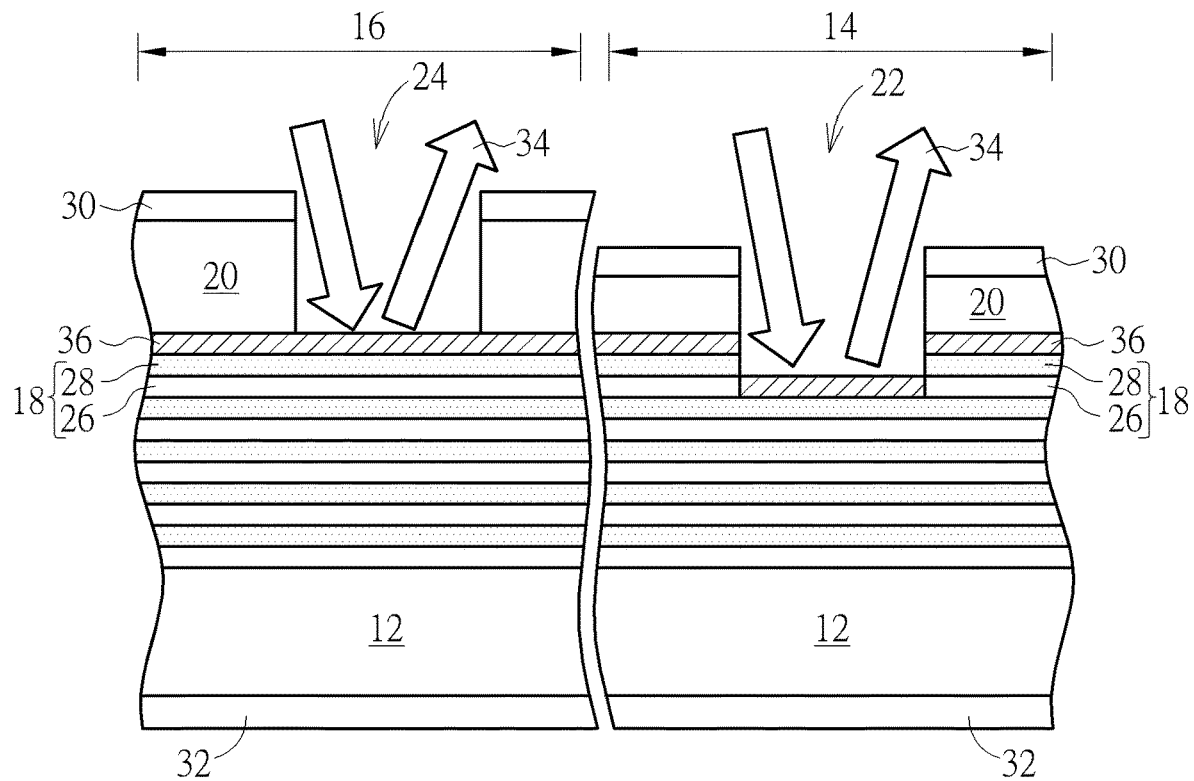
FIG. 4 illustrates a structural view of an EUV mask according to an embodiment of the present invention.

Referring to FIG. 4, FIG. 4 illustrates a structural view of an EUV mask according to an embodiment of the present invention.

As shown in FIG. 4, in contrast to the aforementioned embodiment of having the top surface of absorbing layer 20 on the first region 14 to be even with the top surface of absorbing layer 20 on the second region 16, it would be desirable to remove part of the absorbing layer 20 so that the height of absorbing layer 20 on one region being higher than the height of absorbing layer 20 on another region. For instance, it would be desirable to remove part of the absorbing layer 20 on the first region 14 in this embodiment so that the top surface of the absorbing layer 20 on second region 16 is slightly higher than the top surface of the absorbing layer 20 on first region 14 thereby reducing shadowing effect.

Figure 5:
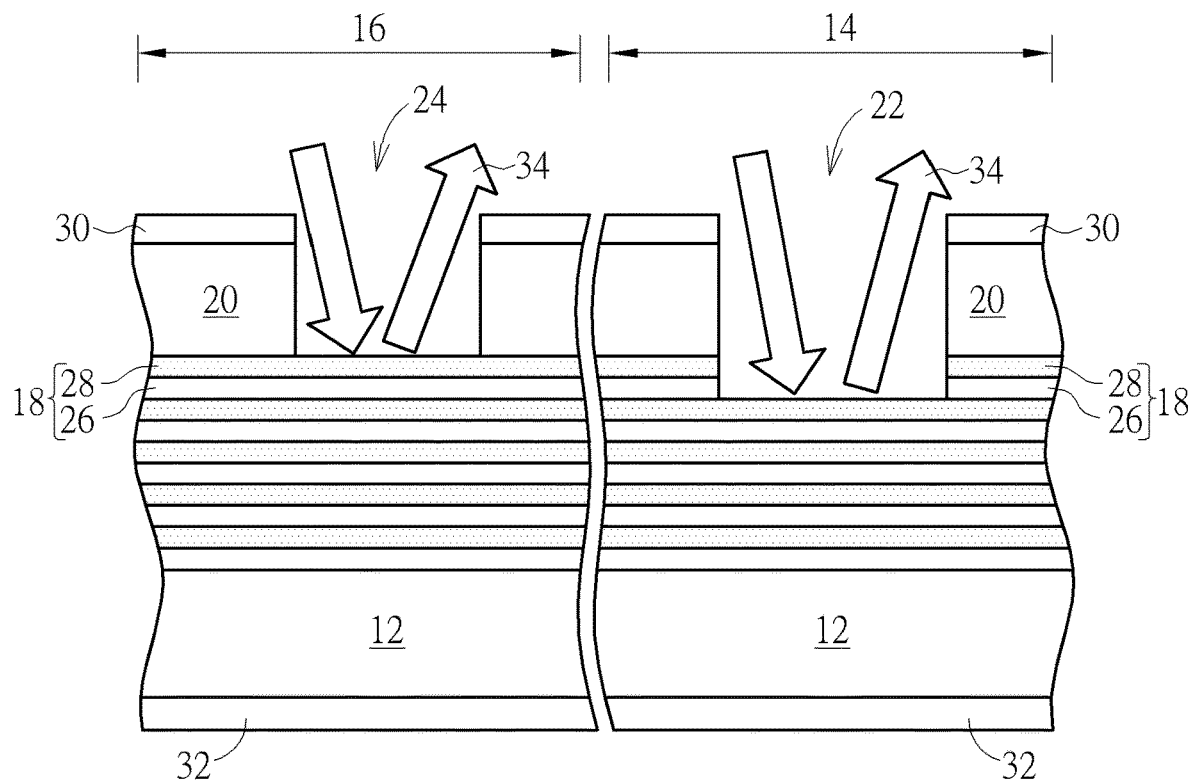
FIG. 5 illustrates a structural view of an EUV mask according to an embodiment of the present invention.
Figure 6:
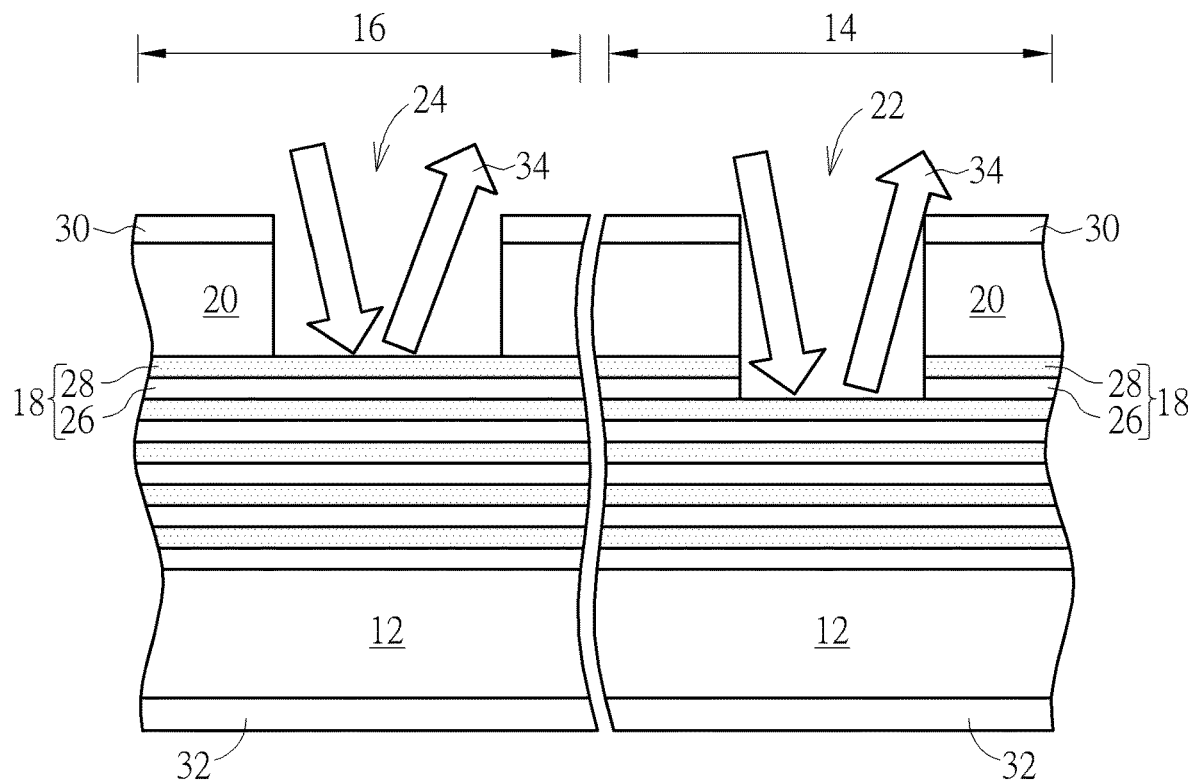
FIG. 6 illustrates a structural view of an EUV mask according to an embodiment of the present invention.

Referring to FIGS. 5-6, FIGS. 5-6 illustrate structural views of an EUV mask according to different embodiments of the present invention. As shown in FIGS. 5-6, in contrast to the aforementioned embodiments of having the width of first recess 22 on first region 14 to be even with the width of second recess 24 on second region 16, it would be desirable to adjust the size of the recess so that the size or width of the first recess 22 to be different from the size or width of the second recess 24. For instance, as shown in FIG. 5, the depth of the first recess 22 is greater than the depth of the second recess 24 while the width of the first recess 22 is also greater than the width of the second recess 24, or as shown in FIG. 6, the depth of the first recess 22 is greater than the depth of the second recess 24 while the width of the first recess 22 is less than the width of the second recess 24, which are all within the scope of the present invention.

Figure 7:
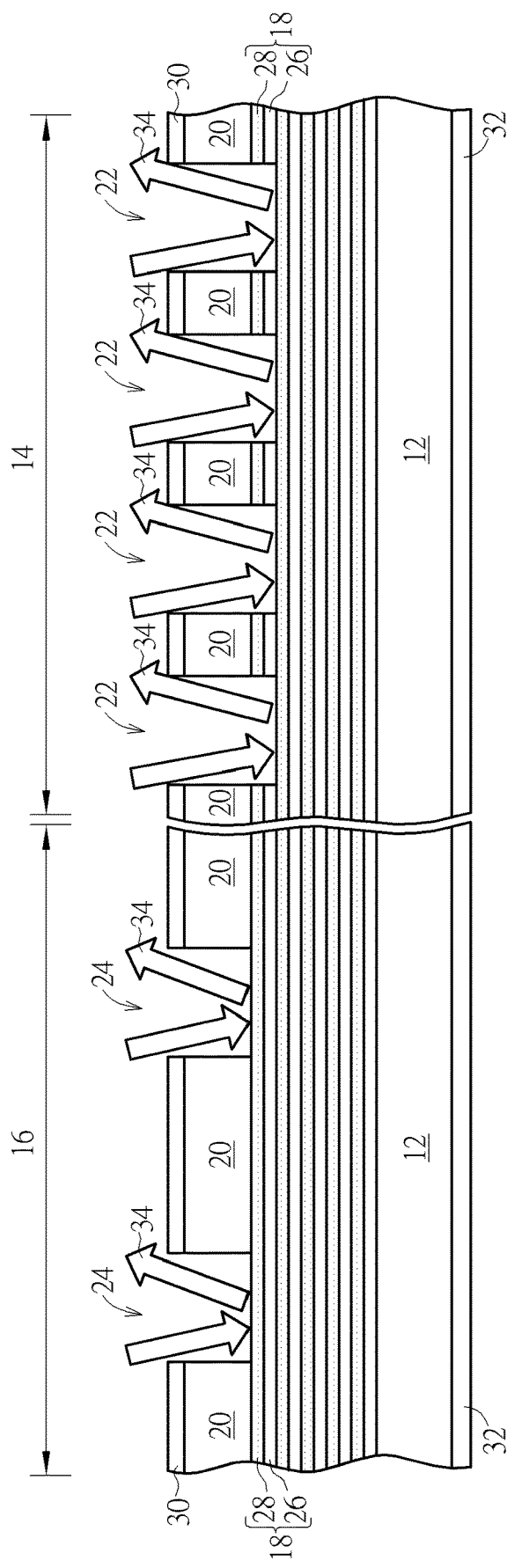
FIG. 7 illustrates a structural view of an EUV mask according to an embodiment of the present invention.
Figure 8:
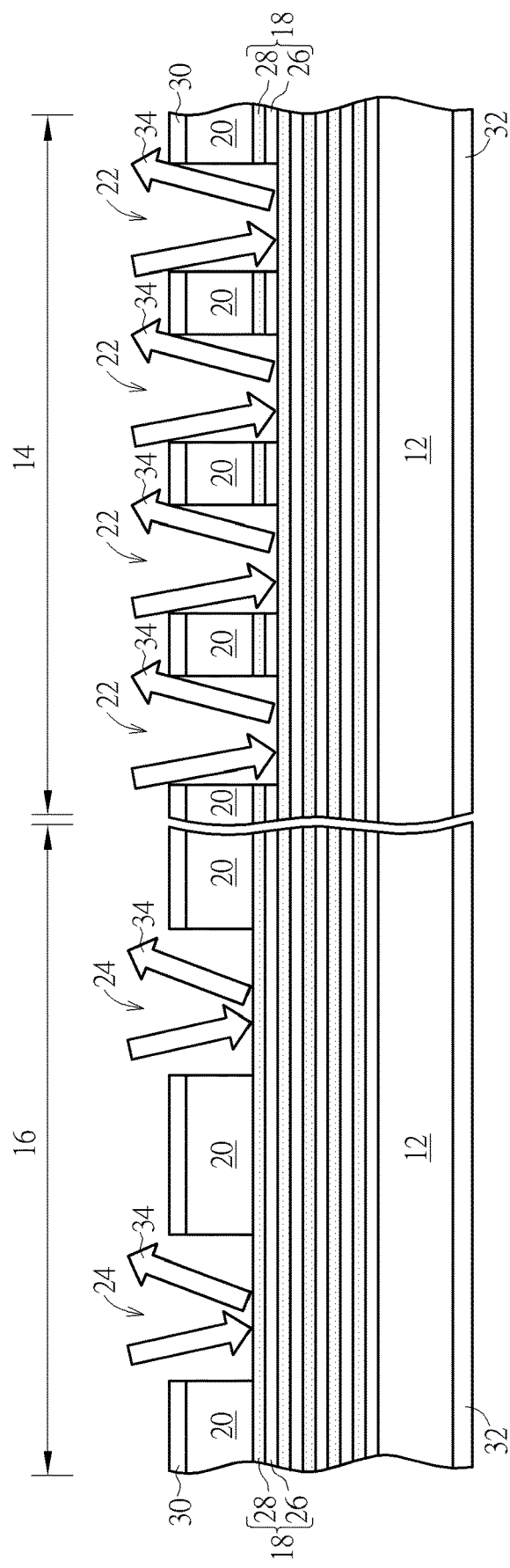
FIG. 8 illustrates a structural view of an EUV mask according to an embodiment of the present invention.

Referring to FIGS. 7-8, FIGS. 7-8 are structural views of an EUV mask according to different embodiments of the present invention. As shown in FIGS. 7-8, in contrast to the aforementioned embodiments of having same number and density of recesses on first region 14 and second region 16, it would be desirable to adjust the quantity and density of the recesses so that the number of the recesses on first region 14 and second region 16 are different. For instance, as shown in FIG. 7, the number or quantity of first recesses 22 on first region 14 is greater than the number of second recesses 24 on second region 16. It should be noted that even though the width of each of the first recesses 22 is equal to the width of each of the second recesses 24, it would also be desirable to incorporate the design from embodiments shown in FIGS. 5-6 so that not only the number of recesses on first region 14 and second region 16 are different, the width of recesses on first region 14 and second region 16 are also different. For instance, as shown in FIG. 8, the width of each of the second recesses 24 is preferably greater than the width of each of the first recesses 22, which are all within the scope of the present invention.

Figure 9:
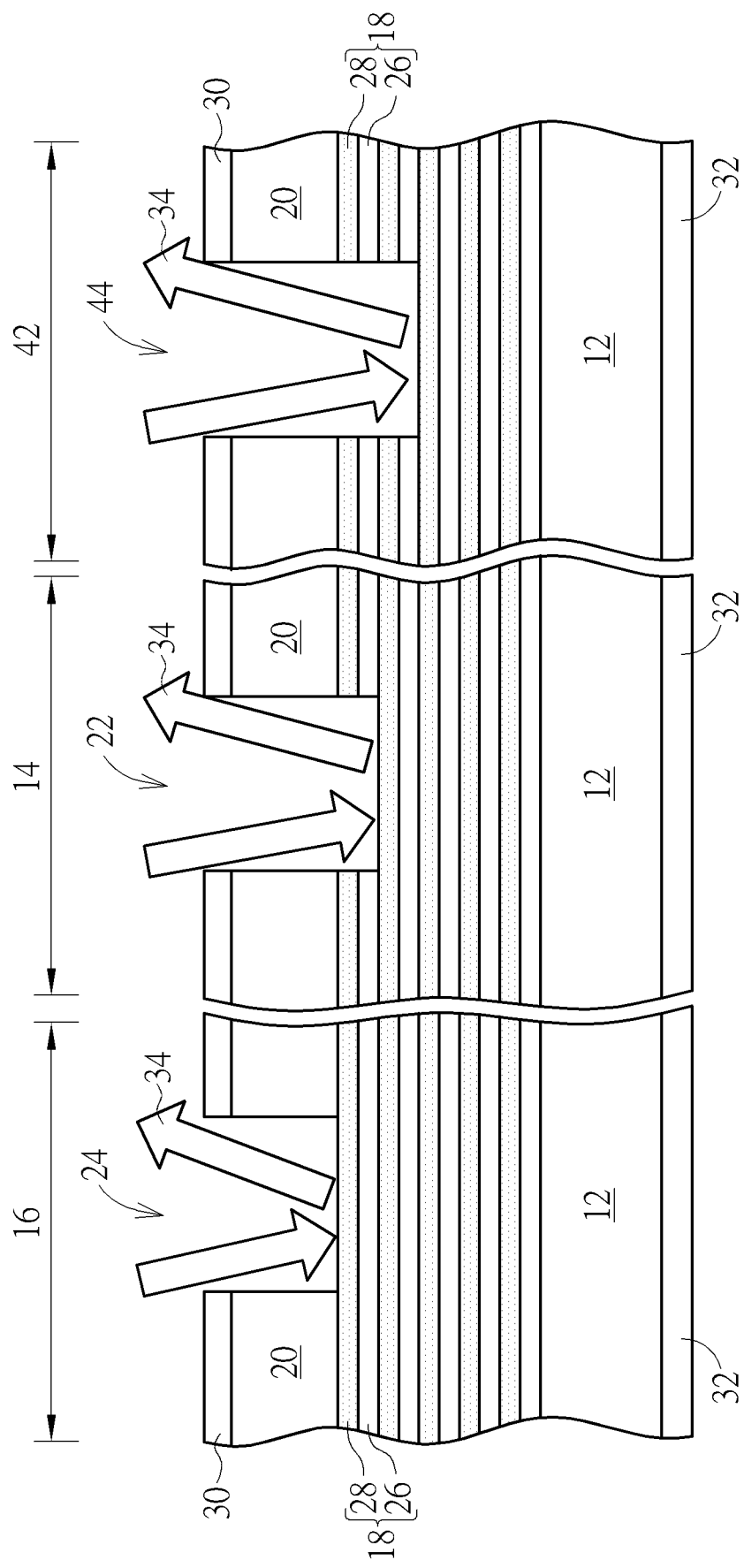
FIG. 9 illustrates a structural view of an EUV mask according to an embodiment of the present invention.

Referring to FIG. 9, FIG. 9 illustrates a structural view of an EUV mask according to an embodiment of the present invention. It should be noted that in addition to having two recesses 22, 24 with different depths on first region 14 and second regions 14 as disclosed in FIG. 1, it would also be desirable to expand the idea by forming additional recess with a depth different from the two recesses 22, 24 on another region on the substrate 12. For instance, as shown in FIG. 9, it would be desirable to define an addition third region 42 on the substrate 12 and form a third recess 44 in the absorbing layer 20 and in part of the reflective layer 18 on the third region 42, in which the depth of the third recess 44 is different from the depths of the first recess 22 and second recess 24 or more specifically deeper than both the first recess 22 and second recess 24 in this embodiment.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An extreme ultraviolet (EUV) mask, comprising:
a substrate having a first region and a second region;
a reflective layer comprising a plurality of first reflective layers and second reflective layers stacked alternately on the substrate;
an absorbing layer on the reflective layer;
a capping layer between the reflective layer and the absorbing layer, wherein the capping layer on the first region comprises a U-shape portion and horizontal portions adjacent to two sides of the U-shape portion and the U-shape portion and the horizontal portions are formed monolithically of the same material, wherein the U-shape portion covers a sidewall of one of the first reflective layers and a sidewall of one of the second reflective layers;
a first recess in the absorbing layer and exposing the U-shape portion of the capping layer, wherein the sidewall of the one of the first reflective layers and the sidewall of the one of the second reflective layers covered by the U-shape portion are vertically aligned with a sidewall of the absorbing layer exposed in the first recess; and
a second recess in the absorbing layer on the second region, wherein a bottom surface of the second recess exposes the top surface of the capping layer and the top surface of the capping layer exposed by the first recess is lower than the top surface of the capping layer exposed by the second recess.

2. The EUV mask of claim 1, wherein a top surface of the reflective layer under the second recess is higher than the top surface of the reflective layer under the first recess.

3. The EUV mask of claim 1, wherein the first reflective layers and the second reflective layers comprise different material.

4. An extreme ultraviolet (EUV) mask, comprising:
a substrate having a first region and a second region;
a reflective layer on the substrate;
an absorbing layer on the reflective layer;
a capping layer between the reflective layer and the absorbing layer, wherein the capping layer on the first region comprises a first portion and a second portion, a bottom surface of the first portion is lower than a bottom surface of the second portion, and the bottom surface of the second portion is even with a bottom surface of the capping layer on the second region, wherein the first portion does not overlap the second portion under a top view, the first portion and the second portion are discontinuous and not in direct contact with each other via a sidewall of the reflective layer, and the capping layer is made of silicon oxide, amorphous carbon, or a combination thereof;
a first recess in the absorbing layer and in part of the reflective layer on the first region, wherein a bottom surface of the first recess exposes a top surface of first portion of the capping layer, a sidewall of the second portion of the cap layer on the first region, a sidewall of the absorbing layer on the first region and the sidewall of the reflective layer are vertically aligned along a sidewall of the first recess; and
a second recess in the absorbing layer on the second region, wherein a bottom surface of the second recess exposes the top surface of the capping layer on the second region.

* * * * *